United States Patent [19]
Luthra

[11] Patent Number: 5,128,886
[45] Date of Patent: Jul. 7, 1992

[54] USING LONG DISTANCE FILTERS IN THE PRESENCE OF ROUND-OFF ERRORS

[75] Inventor: Ajay K. Luthra, Beaverton, Oreg.

[73] Assignee: Tektronix, Inc., Beaverton, Oreg.

[21] Appl. No.: 380,045

[22] Filed: Jul. 14, 1989

[51] Int. Cl.$^5$ .................... G06F 7/38; G06F 15/31
[52] U.S. Cl. .................................. 364/724.03
[58] Field of Search .............. 364/724.01, 724.03, 364/724.16

[56] References Cited

U.S. PATENT DOCUMENTS 4,305,133 12/1981 Amada et al. ............... 364/724.03
4,615,026 9/1986 Schiff ........................ 364/724.16
4,691,293 9/1987 Conboy ...................... 364/724.16
4,862,403 8/1989 Iwase et al. ................. 364/724.16

Primary Examiner—Dale M. Shaw
Attorney, Agent, or Firm—Francis I. Gray

[57] ABSTRACT

The present invention provides a method of using long digital filters in the presence of round-off errors by prescaling each filter coefficient by a scaling factor. The prescaled coefficients are used to weight input data samples. The resulting weighted data values are then divided by the appropriate scaling factor and combined to produce an output data sample.

8 Claims, 3 Drawing Sheets

USING LONG DISTANCE FILTERS IN THE PRESENCE OF ROUND-OFF ERRORS

BACKGROUND OF THE INVENTION

The present invention relates to digital filters, and especially to a method of using long digital filters in the presence of round-off errors by prescaling the coefficients and then dividing the resultant multiplication of data samples and coefficients by the corresponding prescaling factors.

Generally the design procedures used for designing a finite impulse response (FIR) filter assume infinite precision representation of the filter coefficients. In practice the coefficients are of some limited precision only. The quantization/rounding-off of the coefficients adds some noise in the output signal. This degrades the performance of the filter. The longer the length of the filter, the more the quantization noise. As a result the length of the filter gets limited. This results in accepting inferior specifications of the filter as the length directly controls the pass band ripple, stop band attenuation and transition bandwidth. To avoid this problem some optimization routines, such as integer linear programming, are used to optimally round-off the coefficients. These routines are tedious to use and still do not produce satisfactory performance.

A direct form realization of a FIR filter is shown in FIG. 1. The input signal, output signal and coefficients are denoted by x(n), y(n) and c(m), respectively. The x(n) also contains the signal quantization noise. With $q_c(m)$ being the quantization noise in the mth coefficient, the output is given by:

$$\begin{aligned} y(n) &= d\{x(n-m)[c(m) + q_c(m)]\} \\ &= d\{x(n-m)c(m)\} + d\{x(n-m)q_c(m)\} \\ &= y_o(n) + d\{x(n-m)q_c(m)\} \end{aligned}$$

where $y_o(n)$ is the output without the coefficient quantization noise and the summation, d, is over the interval from m=0 to m=N−1, N being the filter length. The second term above contributes to the noise due to the quantization of the coefficients. As the number of coefficients increases, the quantization error increases, putting a limit on the length of the filter and its performance. For an example, let the multipliers be 8×8 and the accumulators be 16 bits long. The output of each multiplier is 16 bits long, but due to the rounding off of the coefficients the last 8 bits contain the quantization noise. If the filter has N coefficients, then approximately the last $8+(\frac{1}{2})\log_2 N$ bits in the output have the quantization noise. Thus if N=16, then only the first 6 bits may have good signal values. In the worst case scenario only the first 4 bits may have noise free values. In FIR filters, especially wideband FIR filters, the coefficients generally are such that only a few of them are large compared to others, as shown in FIG. 2. As the filter length increases, the coefficients in the tail become smaller. The performance, instead of improving, degrades as the filter length is increased.

What is desired is a method of using long digital filters in the presence of round-off errors that does not degrade performance as the filter length is increased.

SUMMARY OF THE INVENTION

Accordingly the present invention provides a method of using long digital filters in the presence of round-off errors by prescaling the filter coefficients, and then dividing the resulting multiplicand. Each coefficient is obtained by prescaling, or magnifying, the filter coefficient by a factor before rounding off, with smaller coefficients having larger scaling factors. The outputs of the filter multipliers are divided by the corresponding scaling factor to produce final weighted values that are then combined to produce the output signal.

The objects, advantages and other novel features of the present invention are apparent from the following detailed description when read in conjunction with the appended claims and attached drawing.

DESCRIPTION OF THE PREFERRED EMBODIMENT

Figure 3:
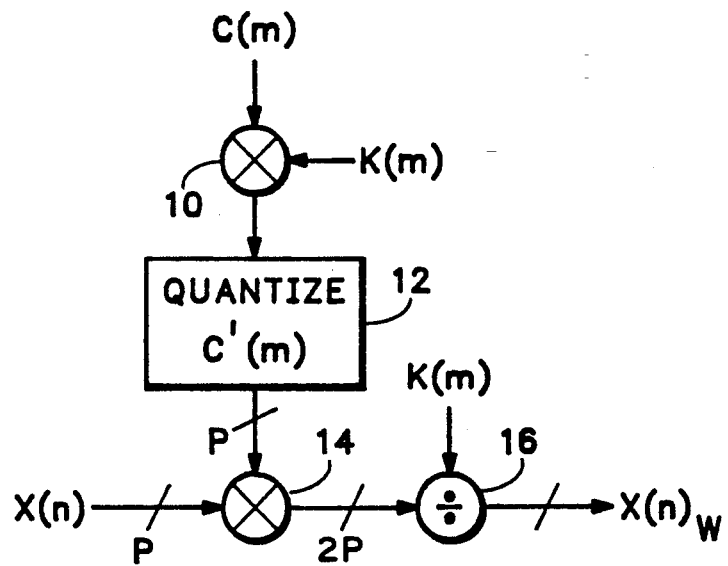
FIG. 3 is a block diagram of a portion of a digital filter according to the present invention.

The present technique takes advantage of the fact that the outputs of the multipliers and summers have higher resolution than the inputs of the multipliers—the data and coefficient values. Referring now to FIG. 3 infinite precision filter coefficients c(m) are input to a prescale multiplier 10 where they are multiplied by corresponding scaling factors k(m). The output of the multiplier 10 is quantized to produce a set of prescaled filter coefficients c'(m) having p bits. The prescaled filter coefficients and input data x(n) having p bits are input to a weighting multiplier 14. The output of the weighting multiplier 14 is input to a divider 16 to be divided by the corresponding scaling factors k(m) to produce the weighted input data $x(n)_w$.

Figure 1:
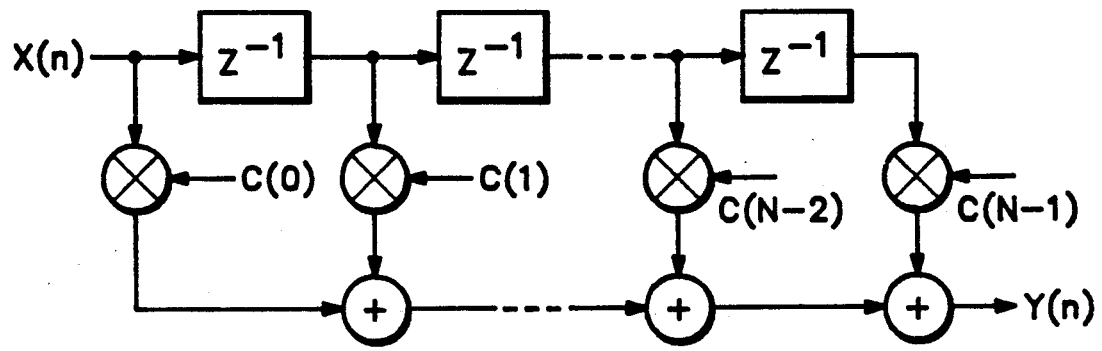
FIG. 1 is a block diagram of a prior art FIR filter.
Figure 2:
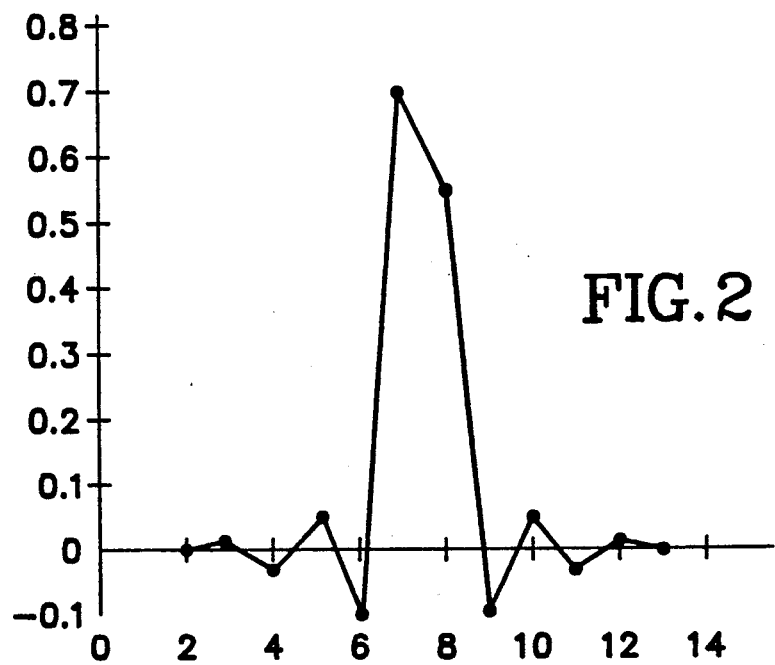
FIG. 2 is a graphic diagram of filter coefficients for a FIR filter.
Figure 4:
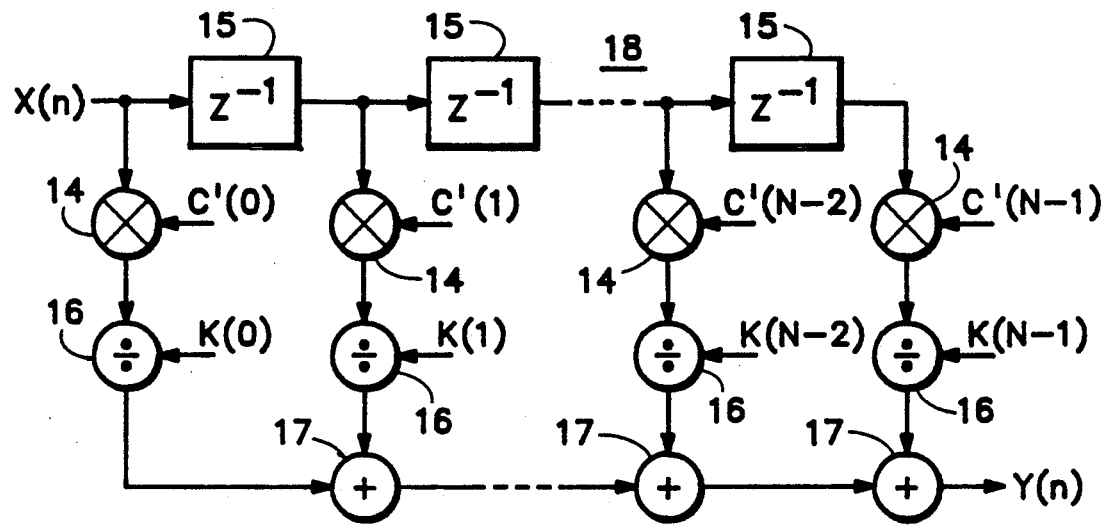
FIG. 4 is a block diagram of a digital filter incorporating the portion shown in FIG. 3 according to the present invention.

A digital filter 18 is shown in FIG. 4 having the input signal x(n) applied to a first multiplier 14 and a first delay element 15. The other input to the first multiplier 14 is the computed coefficient c'(0). The output of the multiplier 14 is input to a divider 16 to which is applied a divisor k(0). Likewise for each filter element the delayed x(n) is multiplied by the appropriate coefficient c'(m), and then divided by the appropriate divisor k(m). The outputs from the dividers 16 are summed in respective summers 17, with the output of the last summer being the filter output y(n) at the output sampling rate.

Figure 5:
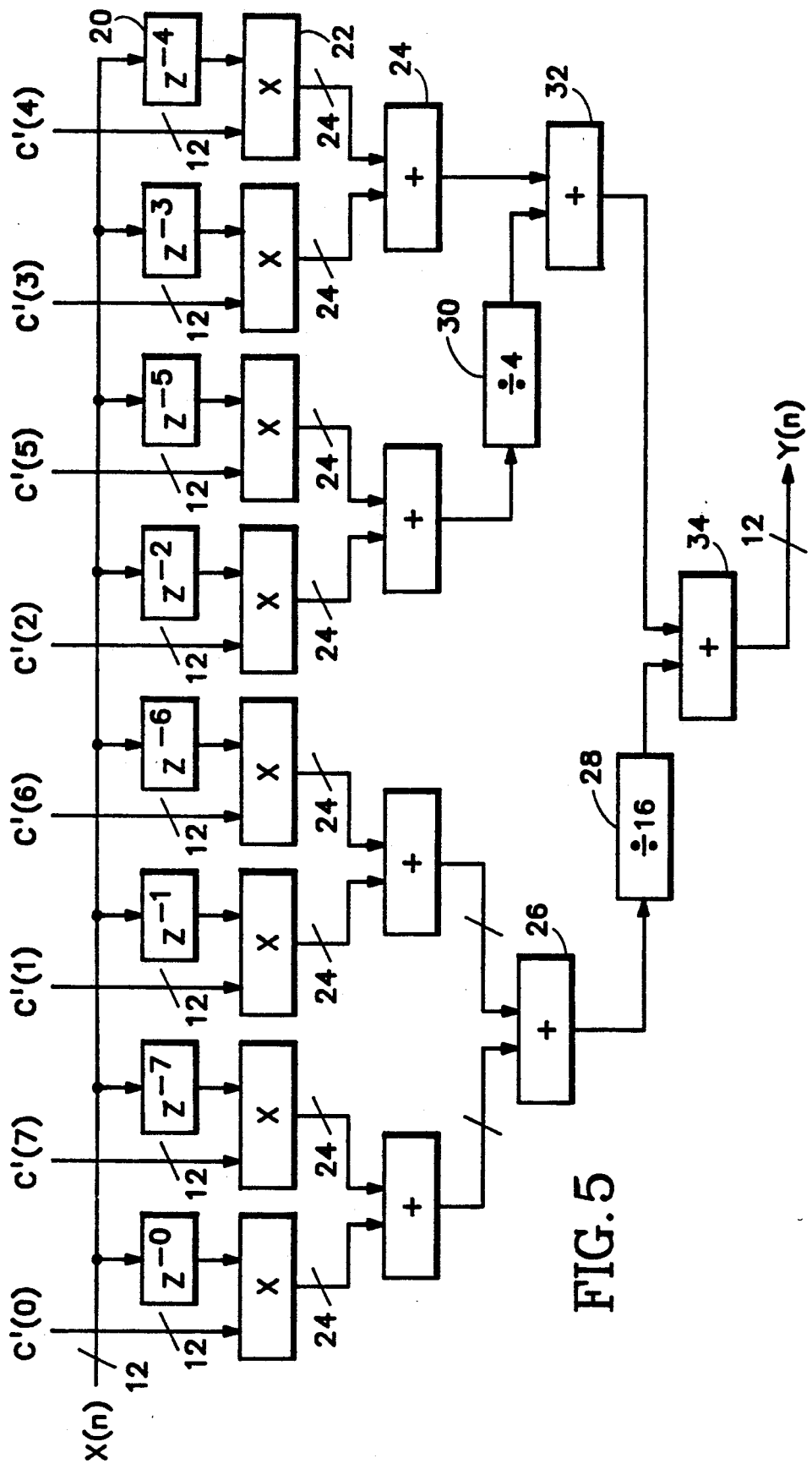
FIG. 5 is a more detailed block diagram of a specific digital filter according to the present invention.

FIG. 5 illustrates a specific embodiment of a digital filter using the present invention. The length of the filter is N so that N samples of the input signal x(n) are combined to produce each sample of the output signal y(n). The input signal x(n) is input to respective delay lines $z^{-i}$ 20, where i indicates the number of samples of delay. The stored prescaled filter coefficients c'(m) together with the outputs of the delay lines 20 are input to respective multipliers 22. Pairs of outputs from the multipliers 22 are input to summers 24. The coefficients c'(0), c'(1), c'(6) and c'(7) have been prescaled by a factor of sixteen, so the outputs of the respective summers 24 are input to another summer 26. The output of the summer 26 is input to a divider 28 that divides the sum by the prescale factor of sixteen. Meanwhile the coefficients c'(2) and c'(5) have been prescaled by a factor of four, so the outputs of the appropriate summer 24 is input to a divider 30 that divides the sum by the prescale factor of four. The coefficients c'(3) and c'(4) have not been prescaled, so the output of the appropriate summer 24 is combined with the output of the divider 30 by summer 32. The outputs of summer 32 and divider 28 finally are combined by summer 34 to produce the output signal y(n).

The scaling factor is chosen to be such that overflow does not occur. In the simplest implementation the scaling is accomplished by left shifting the coefficient value to the most significant bit locations of a coefficient data word, i.e., shift to delete the leading zeros in the coefficient data word. If the scaling factor is a power of two, then division is trivial. In many hardware realizations the division is accomplished by rearranging the wires that come out of the accumulators 24. Also the outputs of the multipliers 22 corresponding to the coefficients with the same scaling factors may be first added and then divided by the scale factor as illustrated in FIG. 5. If the scaling factor for a coefficient is $k(m)$, then after the division the quantization noise power is attenuated by $k^2(m)$. Now the filter is limited by the quantization effects of the summers, which are relatively quite small. Also the smaller the coefficient value, the larger the prescale factor, resulting in smaller quantization noise for smaller coefficients.

Thus the present invention provides a method of using long digital filters in the presence of round-off errors by prescaling the filter coefficients and then dividing the resulting weighted data values by the corresponding scaling factors before combination to produce the output data.

What is claimed is:

1. A method of filtering an input digital signal using a long digital filter in the presence of round-off errors comprising the steps of:
   prescaling filter coefficients for the digital filter by scale factors determined by the size of the value of each filter coefficient;
   weighting input data samples representing the input digital signal by the prescaled filter coefficients;
   dividing the weighted input data samples by the scale factors to produce weighted data samples; and
   combining the weighted data samples to produce output data samples representing a filtered digital signal corresponding to the input digital signal.

2. A long digital filter for filtering an input digital signal in the presence of round-off errors comprising:
   means for prescaling filter coefficients for the long digital filter by scale factors determined by the size of the value of each filter coefficient;
   means for weighting input data samples representing the input digital signal by the prescaled filter coefficients;
   means for dividing the weighted input data samples by the scale factors to produce weighted data samples; and
   means for combining the weighted data samples to produce output data samples representing a filtered digital signal corresponding to the input digital signal.

3. A long digital filter as recited in claim 2 wherein the prescaling means comprises:
   means for multiplying each filter coefficient by the corresponding scale factor to produce a scaled filter coefficient; and
   means for digitizing the scaled filter coefficient to produce the prescaled filter coefficient for each input data sample.

4. A long digital filter as recited in claim 2 further comprising means for delaying the input digital signal to produce the plurality of input data samples at each of a plurality of nodes of the delaying means.

5. A long digital filter as recited in claim 4 wherein the weighting means comprises a plurality of multipliers, one coupled to each node, each multiplier receiving as inputs the input data sample from the node and the corresponding prescaled filter coefficient to produce the weighted input data sample for each input data sample.

6. A long digital filter as recited in claim 5 wherein the dividing means comprises a plurality of dividers, one coupled to the output of each multiplier, each divider receiving as inputs the corresponding weighted input data sample and the factor corresponding to the factor by which the filter coefficient was prescaled to produce the weighted data samples.

7. A long digital filter as recited in claim 6 wherein the combining means comprises a plurality of summers coupled in series, a first summer in the series having as inputs the outputs of the first two weighted data samples, and each subsequent summer having as inputs the output of the previous summer and the corresponding weighted data sample, the output of a last summer in the series producing the output data samples.

8. A long digital filter comprising:
   means for delaying an input digital signal, the delaying means having a plurality of nodes to produce a plurality of input data samples, one at each node;
   means for multiplying each input data sample by a corresponding prescaled filter coefficient to produce weighted input data samples;
   means for summing symmetrical pairs of the weighted input data samples to produce weighted data samples;
   means for dividing the weighted data samples by a scale factor corresponding to the prescaled filter coefficient used to produce the weighted input data samples to produce weighted output data samples; and
   means for summing the weighted output data samples to produce an output data sample for a filtered digital signal corresponding to the input digital signal.

* * * * *